(12) United States Patent
Chen et al.

(10) Patent No.: US 11,588,612 B2
(45) Date of Patent: Feb. 21, 2023

(54) COMMUNICATION CHIP

(71) Applicant: REALTEK SEMICONDUCTOR CORP., Hsinchu (TW)

(72) Inventors: Jon-Jin Chen, Hsinchu (TW); Chia-Jun Chang, Hsinchu (TW); Ka-Un Chan, Hsinchu (TW); Yi-Ching Wu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/506,022

(22) Filed: Oct. 20, 2021

(65) Prior Publication Data

US 2022/0255717 A1 Aug. 11, 2022

(30) Foreign Application Priority Data

Feb. 8, 2021 (TW) .................................. 110104825

(51) Int. Cl.
*H04L 7/00* (2006.01)
*H04L 27/20* (2006.01)
*H04L 7/033* (2006.01)

(52) U.S. Cl.
CPC .......... *H04L 7/0037* (2013.01); *H04L 7/0087* (2013.01); *H04L 7/0331* (2013.01); *H04L 27/20* (2013.01)

(58) Field of Classification Search
CPC . H04B 1/38; H04B 1/40; H04B 1/401; H04B 17/10; H04B 17/11; H04B 17/13;
(Continued)

(56) References Cited

U.S. PATENT DOCUMENTS 6,346,910 B1    2/2002  Ito
7,082,290 B2*   7/2006  Takano ................ H03G 3/3047
                                                  375/302
(Continued)

FOREIGN PATENT DOCUMENTS

CN          109155678 A       1/2019

OTHER PUBLICATIONS

Hioe et al., "Gain Calibration and Feedforward Automatic Gain Control for CMOS Radio-Frequency ICs", 2003 Symposium on VLSI Circuits Digest of Technical Papers, pp. 127-130.
(Continued)

*Primary Examiner* — Betsy Deppe
(74) *Attorney, Agent, or Firm* — Birch, Stewart, Kolasch & Birch, LLP (57) ABSTRACT

A communication chip includes an input port, a gain circuit, a correction circuit having a phase-locked loop (PLL) circuit and a return terminal, a post-processing circuit, and a switching circuit. The gain circuit includes an input terminal and a quadrature modulation circuit that operates according to a reference clock. The gain circuit gains a signal from the input terminal according to a bias voltage and outputs a gained signal. The PLL circuit generates a correction signal through synchronization according to the reference clock. The post-processing circuit obtains an input signal strength according to a correction table and a signal from a receiving terminal of the post-processing circuit. The switching circuit couples the correction signal to the input terminal and the gained signal to the return terminal in test mode and couples the input port to the input terminal and the gained signal to the receiving terminal in an operating mode.

20 Claims, 4 Drawing Sheets

(58) Field of Classification Search
CPC ........ H04B 17/15; H04B 17/19; H04B 17/20;
H04B 17/21; H04B 17/24; H04B 17/29;
H04B 17/00; H04L 25/02; H04L 7/0037;
H04L 7/0087; H04L 7/0331; H04L 27/20;
H03G 3/004; H03G 3/20
See application file for complete search history.

(56) References Cited

U.S. PATENT DOCUMENTS

| | | | |
|---|---|---|---|
| 9,294,073 B2* | 3/2016 | Homol | H04B 1/40 |
| 9,813,169 B2* | 11/2017 | Einzinger | H04B 1/40 |
| 2006/0160510 A1* | 7/2006 | Seppinen | H04B 17/20 |
| | | | 455/232.1 |
| 2013/0329574 A1 | 12/2013 | Lehtonen et al. | |

OTHER PUBLICATIONS

Liu et al., "A 24 GHz CMOS Mixer Using Symmetrical Design Methodology with I/Q Imbalance Calibration", Proceedings of 2017 Asia Pacific Microwave Conference, 2017, pp. 903-905.

Tsai et al., "V-Band High Data-Rate I/Q Modulator and Demodulator With a Power-Locked Loop LO Source in 0.15-µm GaAs pHEMT Technology", IEEE Transactions On Microwave Theory and Techniques, Jul. 2013, vol. 61, No. 7, pp. 2670-2684.

* cited by examiner

COMMUNICATION CHIP

CROSS-REFERENCE TO RELATED APPLICATION

This non-provisional application claims priority under 35 U.S.C. § 119(a) to Patent Application No. 110104825 filed in Taiwan, R.O.C. on Feb. 8, 2021, the entire contents of which are hereby incorporated by reference.

BACKGROUND

Technical Field

The present invention relates to chip correction technologies, and in particular, to gain correction of a communication chip.

Related Art

When two communication devices transmit signals, signal strengths greatly affect quality of the transmission. This is particularly true in wireless communication. For example, in order to enable a plurality of electronic devices to share channels at the same time without interfering with signals between each other, orthogonal frequency division multiple access (OFDMA) in Wi-Fi 802.11ax requires communication devices to accurately control a power of a to-be-transmitted wireless signal. For example, in the specification of the Wi-Fi 802.11ax, an error in a received signal strength indicator (RSSI) of the signal needs to be less than 3 decibel milliwatts (dBm) to increase a transmission range and a number of transmission data in wireless network transmission.

In accordance with the RSSI specification, a transmitting terminal of the communication device needs to learn a strength of a signal received by a receiving terminal corresponding to the transmitting terminal, so that the transmitting terminal can adjust signal transmission strength accordingly. Since a strength of a wireless signal is often very weak, the receiving terminal of the communication device needs to amplify a received signal by a designed gain value to measure a strength of the amplified signal. The receiving terminal then estimates the strength of the received signal based on the strength of the amplified signal and the designed gain value. However, due to process variability, an actual gain value of an electronic component of the receiving terminal or a chip of the receiving terminal is not the same as the designed gain value. Therefore, in order to ensure that the strength of the received signal estimated by the receiving terminal is close to an actual strength, the receiving terminal corrects a gain value of the signal.

SUMMARY

In view of the above, the present invention provides a communication chip and a gain correction method therefor. In some embodiments, there is a clock correlation between a correction circuit and a gain circuit of the communication chip. Therefore, when the correction circuit corrects the gain circuit without interference from an external signal, so that a correction result is more accurate, and a range of errors in gains is reduced. In this way, the communication chip estimates that a received signal strength value is close to an actual strength.

According to some embodiments, the communication chip has a test mode and an operating mode. The communication chip includes an input port, a clock generation circuit, a gain circuit, a correction circuit, a post-processing circuit, and a switching circuit. The clock generation circuit is configured to generate a reference clock. The gain circuit includes an input terminal and a quadrature modulation circuit. The gain circuit is configured to gain, according to a bias voltage, a to-be-gained signal from the input terminal and output a gained signal. The quadrature modulation circuit operates according to the reference clock to generate a signal for gaining the to-be-gained signal. The correction circuit includes a phase-locked loop circuit and a return terminal. The phase-locked loop circuit is configured to generate a correction signal through synchronization according to the reference clock. The post-processing circuit includes a receiving terminal. The post-processing circuit is configured to obtain, according to a correction table and a signal from the receiving terminal, an input signal strength. In the test mode, the switching circuit couples the correction signal to the input terminal and couples the gained signal to the return terminal. In the operating mode, the switching circuit couples the input port to the input terminal and couples the gained signal to the receiving terminal.

According to some embodiments, the communication chip has a test mode and an operating mode. The communication chip includes an input port, a clock generation circuit, a gain circuit, a correction circuit, a post-processing circuit, and a switching circuit. The input port is configured to receive an input signal. The clock generation circuit is configured to generate a reference clock. The gain circuit includes a first input terminal, a second input terminal, and a quadrature modulation circuit. In the test mode, the gain circuit gains, according to a correction voltage, a correction signal from the first input terminal to output a gained signal. In the operating mode, the gain circuit gains, according to a target voltage, the input signal from the second input terminal to output the gained signal. The quadrature modulation circuit operates according to the reference clock to generate a signal for gaining the correction signal and the input signal. The correction circuit includes a phase-locked loop circuit and a return terminal. The phase-locked loop circuit is configured to generate a correction signal through synchronization according to the reference clock. The post-processing circuit includes a receiving terminal. The post-processing circuit is configured to obtain, according to a correction table and a signal from the receiving terminal, an input signal strength of the input signal. In the test mode, the switching circuit couples the correction signal to the first input terminal and couples the gained signal to the return terminal. In the operating mode, the switching circuit couples the input signal to the second input terminal and couples the gained signal to the receiving terminal.

Based on the above, according to some embodiments of the present invention, there is a clock correlation between the correction circuit and the gain circuit of the communication chip, thereby reducing a possibility of signal interference during the correction (for example, avoiding signal loss, matching loss, a frequency shift, and the like caused by an excessively long connection line of the correction circuit), and reducing a time course of gain correction and an error that occurs during the gain correction. In some embodiments, the correction circuit of the chip may be turned on and off. Therefore, a user may turn on the correction circuit when the gain correction is required, and turn off the correction circuit when the gain correction is not required, so as to save energy of the communication chip and prevent a signal path and a function of the communication chip in a normal operating state from being interfered by the correction circuit.

DETAILED DESCRIPTION

Terms such as "first" and "second" used herein are used to distinguish between referred components, rather than being used to sort the referred components or limit differences in the referred components or limit the scope of the present invention. In addition, terms such as "coupling" or "connecting" used refers to two or more components directly in physical or electrical contact with each other, or indirectly in physical or electrical contact with each other. For example, an expression that "a first device is coupled to a second device" described herein indicates that the first device may be directly electrically connected to the second device or indirectly electrically connected to the second device through other devices or connecting means.

Figure 1:
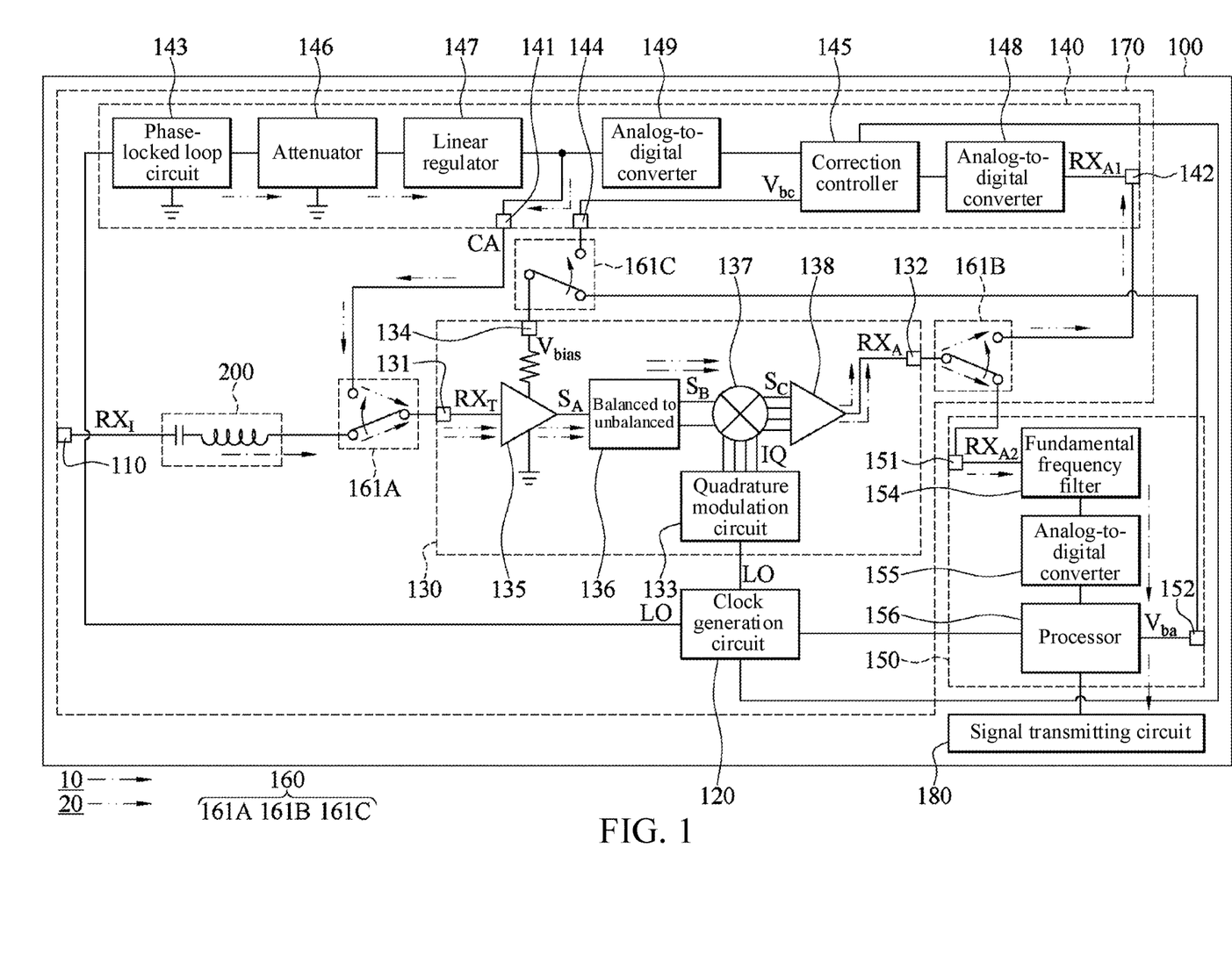
FIG. 1 is a schematic block diagram of a communication chip according to some embodiments of the present invention.

Referring to FIG. 1, FIG. 1 is a schematic block diagram of a communication chip 100 according to some embodiments of the present invention. The communication chip 100 includes an input port 110, a clock generation circuit 120, a gain circuit 130, a correction circuit 140, a post-processing circuit 150, and a switching circuit 160. In some embodiments, the input port 110, the clock generation circuit 120, the gain circuit 130, the correction circuit 140, and the switching circuit 160 may be included in a signal receiving circuit 170 of the communication chip 100. The communication chip 100 can perform a radio frequency characteristic test in a test mode. The radio frequency characteristic test is a variability correction test for signal gains in a chip, but this does not constitute a limitation on embodiments of the present invention. The radio frequency characteristic test may be performed by the correction circuit 140 and the gain circuit 130.

Figure 2:
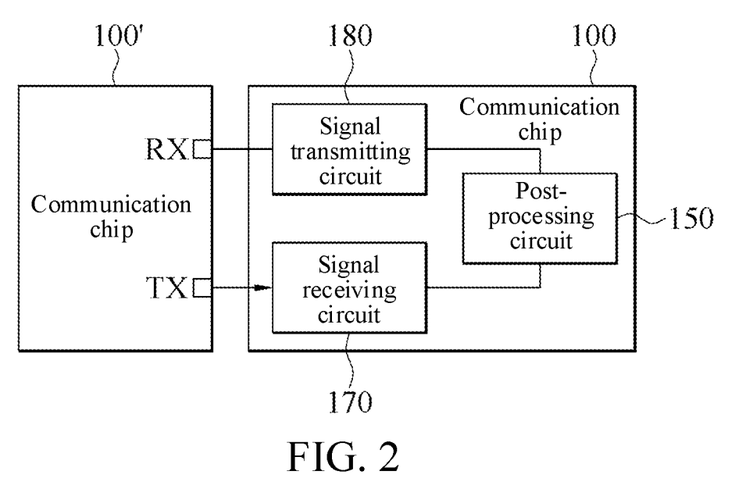
FIG. 2 is a schematic block diagram of two communication chips according to some embodiments of the present invention.

Referring to FIG. 2, FIG. 2 is a schematic block diagram of two communication chips 100, 100' according to some embodiments of the present invention. In an operating mode, signals are transmitted between the communication chip 100 and another communication chip 100'. Specifically, the communication chip 100 may include a signal transmitting circuit 180. The communication chip 100' includes a signal receiving terminal RX and a signal transmitting terminal TX. The post-processing circuit 150 is coupled to the signal receiving circuit 170 and the signal transmitting circuit 180. The signal receiving circuit 170 is coupled to the signal transmitting terminal TX of the another communication chip 100', and the signal transmitting circuit 180 is coupled to the signal receiving terminal RX of the another communication chip 100'. For example, when the communication chip 100 is in the operating mode, the signal receiving circuit 170 of the communication chip 100 receives a data signal from the signal transmitting terminal TX of the communication chip 100', and the signal receiving circuit 170 amplifies the data signal by a designed gain value. Then, the post-processing circuit 150 obtains a signal strength of the data signal (before amplified) according to the amplified data signal (detailed later). The post-processing circuit 150 returns, to the signal receiving terminal RX of the communication chip 100' by using the signal transmitting circuit 180, a return signal associated with the data signal (for example, the return signal carries the signal strength (such as an RSSI value) of the data signal or data related to quality of the signal). In some embodiments, the communication chip 100 executes only one of the test mode and the operating mode at a time point.

In some embodiments, the signal transmission between the two communication chips 100, 100' may be a wired signal transmission or a wireless signal transmission. The wired signal transmission may be implemented by a circuit that supports a physical connection line, for example, a physical line supporting a communication protocol such as a universal serial bus (USB), a FireWire (which generally refers to IEEE 1394-2006), a universal asynchronous receiver/transmitter (UART), an inter-integrated circuit ($I^2C$), a display port (DP), a serial peripheral interface (SPI), a system management bus (SMBus), Inter-IC sound or integrated interchip sound (I2S), peripheral component interconnect (PIC), or the like. The wireless signal transmission may be performed by a Wi-Fi module, a Bluetooth module, a radio frequency module, or the like. The radio frequency module is used as an example. The signal transmitting circuit 180 and the signal transmitting terminal TX are radio frequency transmitting modules, the signal receiving circuit 170 and the signal receiving terminal RX are radio frequency receiving modules, and in this case, the communication chips 100, 100' may be a chip (for example, a chip including an antenna and a processor) with a radio frequency communication function.

In subsequent embodiments, the signal transmitting circuit 180 and the signal transmitting terminal TX are radio frequency transmitting modules. The signal receiving circuit 170 and the signal receiving terminal RX are radio frequency receiving modules.

Referring to FIG. 1 again, in the operating mode, the communication chip 100 operates via a signal path 10 (a path shown by a one-dot chain line in the drawing). The input port 110 of the communication chip 100 is coupled to the signal transmitting terminal TX of the communication chip 100'. The gain circuit 130 includes an input terminal 131, and the post-processing circuit 150 includes a receiving terminal 151. In the operating mode, the input port 110 of the communication chip 100 receives a signal (which is referred to as an input signal $RX_I$) from the signal transmitting terminal TX of the communication chip 100', and the input signal $RX_I$ is transmitted to the input terminal 131 of the gain circuit 130 through the switching circuit 160. The input signal $RX_I$ may be a radio frequency signal. The gain circuit 130 gains a signal (which is the input signal $RX_I$ herein) inputted from the input terminal 131, and outputs a gained signal $RX_A$ to the receiving terminal 151 of the post-processing circuit 150 (the gained signal received by the receiving terminal 151 is referred to as $RX_{A2}$ to avoid confusion). The post-processing circuit 150 obtains, according to a correction table (detailed later) and the signal (the gained signal $RX_{A2}$) from the receiving terminal 151, a signal strength of the signal (that is, an input signal strength of the input signal $RX_I$, that is, a signal strength of the input signal $RX_I$ before amplified) received by the input port 110 of the signal receiving circuit 170. The post-processing circuit 150 returns the input signal strength of the input signal $RX_I$ to the signal receiving terminal RX of the communication chip 100' through the signal transmitting circuit 180. The input signal strength may be an RSSI value of the input signal $RX_I$.

As described above, the gain circuit 130 has corresponding designed gain values for different frequencies. However, due to factors such as a manufacturing process, there is a difference (which is also referred to as an error) between the actual gain value and the designed gain value. The correction table is used to correct the error. The designed gain value is obtained by designing circuit characteristics of the gain circuit 130 during circuit designing, so that the gain circuit 130 can gain a received signal by using the designed gain value. The actual gain value is an actual gain value of the gain circuit 130 when the gain circuit gains the received signal by using the designed gain value. Therefore, the post-processing circuit 150 obtains, according to a frequency and a signal strength of the gained signal $RX_{A2}$ of the receiving terminal 151 and the correction table, the actual gain value. Then, the post-processing circuit 150 compensates the actual gain value to the signal strength of the gained signal $RX_{A2}$ of the receiving terminal 151 to obtain the input signal strength of the input signal $RX_I$ (that is, obtain a signal strength the same as or close to an actual strength of the input signal $RX_I$). The actual strength refers to an actual signal strength of the input signal $RX_I$. The post-processing circuit 150 combines the input signal strength with (or places the input signal strength in) the return signal, and transmits the return signal to the signal receiving terminal RX of the communication chip 100' through the signal transmitting circuit 180.

In the test mode, the communication chip 100 operates in a signal path 20 (a path shown by a two-dot chain line in the drawing). The correction circuit 140 includes a return terminal 142. In the test mode, the correction circuit 140 generates a correction signal CA, and the correction signal CA is transmitted to the input terminal 131 of the gain circuit 130 through the switching circuit 160. The correction signal CA is a signal used to obtain the actual gain value of the gain circuit 130 through testing. The gain circuit 130 gains a signal (which is the correction signal CA) from the input terminal 131, and then outputs a gained signal $RX_A$ to the return terminal 142 of the correction circuit 140 (the gained signal received by the return terminal 142 is referred to as $RX_{A1}$ to avoid confusion). The correction circuit 140 generates, according to the correction signal CA and the signal (the gained signal $RX_{A1}$) from the return terminal 142, a correction table. Thus, since the correction circuit 140 that performs the correction test is disposed inside the communication chip 100, connection lines between the correction circuit 140 and other components in the communication chip 100 are relatively short, thereby reducing a possibility that the signal is subjected to interference during the correction test in the test mode. In other words, the correction table generated by the correction circuit 140 may be more accurate. In some embodiments, in order to obtain the actual gain value of the gain circuit 130 through testing when the gain circuit 130 performs gaining by using designed gain values corresponding to different frequencies, the correction signal CA is used to simulate the input signal $RX_I$, for example, the frequency and the signal strength of the correction signal CA are used to simulate the frequency and the actual strength of the input signal $RX_I$.

In some embodiments, the correction circuit 140 may be coupled to the post-processing circuit 150 (not shown). The correction circuit 140 includes a memory (not shown), and the correction table is stored in the memory. The post-processing circuit 150 may obtain a corresponding actual gain value by reading the memory. In some embodiments, the post-processing circuit 150 includes a memory (not shown). The memory stores the correction table, and the post-processing circuit 150 obtains a corresponding actual gain value by reading the correction table. In some embodiments, a user inputs the correction table to the memory of the post-processing circuit 150 through an input/output interface (not shown). The input/output interface may be a keyboard, a mouse, a touch input device, a voice input device, or the like.

The switching circuit 160 is configured to switch the communication chip 100 between use of the signal path 10 or use of the signal path 20. The switching circuit 160 further includes a plurality of switches 161A, 161B, 161C, 161D, 161E, 161F, and 161G. The switches 161A, 161B, 161C, 161D, 161E, 161F, and 161G are synchronously actuated to be in a first state or a second state at the same time. For example, the switches are synchronously actuated or synchronously not actuated to be in the first state or the second state at the same time. The switches 161A, 161B, 161C, 161D, 161E, 161F, and 161G are respectively disposed at different positions in the communication chip 100. In the operating mode of the communication chip 100 (that is, in the signal path 10), the switching circuit 160 and its internal switches 161A, 161B, 161C, 161D, 161E, 161F, and 161G are in the second state. In the test mode of the communication chip 100 (that is, in the signal path 20), the switching circuit 160 and its internal switches 161A, 161B, 161C, 161D, 161E, 161F, and 161G are in the first state. In some embodiments, the switches 161A, 161B, 161C, 161D, 161E, 161F, and 161G may be implemented by electronic switches (such as transistors).

For example, in the operating mode, the first switch 161A and the second switch 161B are used as an example for description. The first switch 161A is coupled between the input port 110, a correction terminal 141 of the correction circuit 140, and the input terminal 131 of the gain circuit 130. The second switch 161B is coupled between the receiving terminal 151 of the post-processing circuit 150, the return terminal 142 of the correction circuit 140, and the output terminal 132 of the gain circuit 130. In the operating mode, the first switch 161A is in the second state. The first switch 161A cuts off the connection between the correction terminal 141 of the correction circuit 140 and the input terminal 131 of the gain circuit 130 (disconnects the correction terminal from the input terminal, that is, a conduction between the correction terminal and the input terminal is not established), and the first switch 161A connects the input terminal 131 of the gain circuit 130 to the input port 110 (that is, a conduction between the input terminal 131 and the input port 110 is established). In the operating mode, the second switch 161B is in the second state. The second switch 161B cuts off the connection between the return terminal 142 of the correction circuit 140 and the output terminal 132 of the gain circuit 130 (disconnects the return terminal 142 from the output terminal 132, that is, a conduction between the return terminal 142 and the output terminal 132 is not established), and the second switch 161B connects the output terminal 132 of the gain circuit 130 to the receiving terminal 151 of the post-processing circuit 150 (that is, a conduction between the output terminal 132 and the receiving terminal 151 is established). Thus, the signal path 10 is formed. Therefore, in the operating mode, the switching circuit 160 couples the input port 110 (that is, the input signal $RX_I$ of the input port 110) to the input terminal 131 of the gain circuit 130 and couples the gained signal $RX_A$ of the gain circuit 130 to the receiving terminal 151 of the post-processing circuit 150 to form the signal path 10.

For another example, in the test mode, the first switch 161A is in the first state. The first switch 161A connects the correction terminal 141 of the correction circuit 140 to the input terminal 131 of the gain circuit 130 (that is, a conduction between the correction terminal 141 and input terminal 131 is established), and the first switch 161A cuts off the connection between the input terminal 131 of the gain circuit 130 and the input port 110 (disconnects the input terminal 131 from the input port 110, that is, a conduction between the input terminal 131 and the input port 110 is not established). In the test mode, the second switch 161B is in the first state. The second switch 161B connects the return terminal 142 of the correction circuit 140 to the output terminal 132 of the gain circuit 130 (that is, a conduction between the return terminal 142 and the output terminal 132 is established), and the second switch 161B cuts off the connection between the output terminal 132 of the gain circuit 130 and the receiving terminal 151 of the post-processing circuit 150 (disconnects the output terminal 132 from the receiving terminal 151, that is, a conduction between the output terminal 132 and the receiving terminal 151 is not established). Thus, the signal path 20 is formed. Therefore, in the test mode, the switching circuit 160 couples the correction signal CA of the correction circuit 140 to the input terminal 131 of the gain circuit 130 and couples the gained signal $RX_A$ of the gain circuit 130 to the return terminal 142 of the correction circuit 140 to form the signal path 20.

The communication chip 100 may execute only one of the test mode and the operating mode at a time point. Thus, the switching circuit 160 can save energy of the communication chip 100. For example, in the operating mode, the connection between the correction circuit 140 and the gain circuit 130 is cut off (the correction circuit 140 is disconnected from the gain circuit 130, that is, the conduction between the correction circuit 140 and the gain circuit 130 is not established). In this case, the correction circuit 140 may not be supplied with power or only with power for maintaining some functions of the correction circuit 140 (for example, power for maintaining a function of the post-processing circuit 150 to read the correction table). Conversely, in the test mode, since the connection between the post-processing circuit 150, the input port 110 and the gain circuit 130 is cut off (the post-processing circuit, the input port, and the gain circuit are disconnected from each other, that is, the conduction between the post-processing circuit, the input port, and the gain circuit is not established), the post-processing circuit 150 may not be supplied with power to achieve power saving.

In some embodiments, the post-processing circuit 150 sets the switching circuit 160 in response to a control command to switch the communication chip 100 to the test mode or the operating mode. Specifically, the post-processing circuit 150 transmits an enable signal to the switching circuit 160 (not shown) in response to the control command, and the switching circuit 160 switches the connection state in response to the enable signal, thereby switching the communication chip 100 from the test mode to the operating mode or switching the communication chip 100 from the operating mode to the test mode. For example, the switches 161A, 161B, 161C, 161D, 161E, 161F, and 161G of the switching circuit 160 synchronously switch the connection state in response to the enable signal (for example, switch the connection state from the second state to the first state or from the first state to the second state), to switch the communication chip 100 to operating by using the signal path 20 or operating by using the signal path 10, thereby switching the communication chip 100 to the test mode or the operating mode. In some embodiments, the post-processing circuit 150 may receive, through an input/output interface (not shown), the control command inputted by the user. Alternatively, the post-processing circuit 150 presets a rule to generate a control command under some circumstances.

The gain circuit 130 gains a signal from the input terminal 131 (which is referred to as a to-be-gained signal $RX_T$ below) according to a bias voltage $V_{bias}$, and the gain circuit 130 outputs a gained signal $RX_A$. Specifically, since the gain circuit 130 may be designed with bias voltages $V_{bias}$ corresponding to different designed gain values during circuit designing, the gain circuit 130 performs, according to the designed gain value corresponding to the bias voltage $V_{bias}$, gaining. For example, a higher bias voltage $V_{bias}$ corresponds to a larger designed gain value, and a lower bias voltage $V_{bias}$ corresponds to a smaller designed gain value. The gain circuit 130 amplifies, according to the designed gain value corresponding to the current bias voltage $V_{bias}$, the to-be-gained signal $RX_T$ of the input terminal 131 (for example, increases an amplitude of the to-be-gained signal $RX_T$), and the gain circuit 130 outputs an amplified signal $RX_T$ (that is, the gained signal $RX_A$). In an example, in the operating mode, the gain circuit 130 gains the input signal $RX_I$ by using the input signal $RX_I$ as the to-be-gained signal $RX_T$, that is, in the operating mode, the gain circuit 130 gains the input signal $RX_I$. In another example, in the test mode, the gain circuit 130 gains the correction signal CA by using the correction signal CA as the to-be-gained signal $RX_T$, that is, in the test mode, the gain circuit 130 gains the correction signal CA. In some embodiments, the gain circuit 130 further includes an output terminal 132, and the gain circuit 130 outputs the gained signal $RX_A$ through the output terminal 132. For example, the gain circuit 130 outputs the gained signal $RX_A$ to the second switch 161B through the output terminal 132.

The correction circuit 140 further includes a phase-locked loop circuit 143. The phase-locked loop circuit 143 generates a correction signal CA through synchronization according to a reference clock LO. For example, the phase-locked loop circuit 143 includes a phase frequency detector (PFD), a low-pass filter, a voltage-controlled oscillator, and a frequency divider (not shown). The phase frequency detector determines whether a frequency and a phase of the reference clock LO match a frequency and a phase of a feedback signal from the frequency divider. If the frequency and the phase of the reference clock LO match the frequency and the phase of the feedback signal, the voltage-controlled oscillator outputs a currently generated clock signal as the correction signal CA. If the frequency and the phase of the reference clock LO mismatch the frequency and the phase of the feedback signal, the phase frequency detector outputs, to the low-pass filter, a frequency and phase adjustment signal having a frequency difference and a phase difference between the reference clock LO and the feedback signal. The low-pass filter generates a frequency and phase adjustment voltage after performing high-frequency filtering. The voltage-controlled oscillator adjusts, according to the frequency and phase adjustment voltage, a phase and a frequency of the clock signal generated by the voltage-controlled oscillator. The frequency divider reduces the frequency of the adjusted clock signal to generate a feedback signal, and the frequency divider transmits the feedback signal to the phase frequency detector for further comparison. Since the frequency of the clock signal generated by the voltage-controlled oscillator is generally greater than the frequency of the reference clock LO, the frequency of the clock signal is reduced by the frequency divider, so that the reference clock LO and the clock signal can quickly match.

In some embodiments, the correction circuit 140 further includes a correction terminal 141. The phase-locked loop circuit 143 is coupled to the correction terminal 141. The phase-locked loop circuit 143 outputs the correction signal CA through the correction terminal 141. For example, the phase-locked loop circuit 143 outputs the correction signal CA to the first switch 161A through the correction terminal 141.

The gain circuit 130 further includes a quadrature modulation circuit 133. The clock generation circuit 120 is configured to generate a reference clock LO. The clock generating circuit 120 is coupled to the phase-locked loop circuit 143 of the correction circuit 140 and the quadrature modulation circuit 133 of the gain circuit 130. The quadrature modulation circuit 133 operates according to the reference clock LO. Specifically, the quadrature modulation circuit 133 performs, according to the reference clock LO, quadrature modulation to generate a quadrature signal IQ for gaining the to-be-gained signal RXT. The quadrature signal IQ includes an in-phase signal and a quadrature-phase signal. The phase-locked loop circuit 143 (refer to FIG. 1) generates the correction signal CA through synchronization according to the reference clock LO. Since the phase-locked loop circuit 143 of the correction circuit 140 and the quadrature modulation circuit 133 of the gain circuit 130 use the same reference clock LO, there is a clock correlation between the correction signal CA and the quadrature signal IQ. For example, phases of the correction signal CA and the quadrature signal IQ are synchronized, or the phase of the correction signal CA slightly leads or lags the phase of the quadrature signal IQ. The clock generation circuit 120 may be an oscillator circuit. The oscillator circuit may be a crystal oscillator, a voltage-controlled oscillator, or the like. For example, the voltage-controlled oscillator serves as the clock generation circuit 120. The reference clock LO may be a clock signal formed by dividing, by two, a frequency of a signal generated by the voltage-controlled oscillator through oscillation. Thus, through the clock correlation between the correction signal CA and the quadrature signal IQ, the correction circuit 140 can perform a correction test on the actual gain value of the gain circuit 130, so as to significantly improve accuracy of a correction result obtained after correction by using the correction table.

Referring to FIG. 1 again, in some embodiments, the communication chip 100 further includes an input matching circuit 200. The input matching circuit 200 is coupled between the input port 110 and the first switch 161A of the switching circuit 160. The input matching circuit 200 is configured, in the operating mode, to perform phase matching and impedance matching on the input signal RX$_I$ from the input port 110 and transmit the input signal to the input terminal 131 through the switching circuit 160. For example, in the operating mode, the first switch 161A of the switching circuit 160 is in the second state, and the input matching circuit 200 adjusts a phase and an impedance of the input signal RX$_I$, so that the adjusted phase and impedance of the input signal RX$_I$ match those of other components (for example, the gain circuit 130) in the signal receiving circuit 170, and the input matching circuit 200 transmits the input signal RX$_I$ after adjustments of the phase matching and impedance matching to the input terminal 131 through the first switch 161A. The input matching circuit 200 may be implemented by a passive component (a resistor, a capacitor, and an inductor) composed of a phase shifter and an impedance matching circuit.

In some embodiments, the correction circuit 140 further includes an attenuator 146. In the test mode, the switching circuit 160 is in the first state, and the attenuator 146 performs signal attenuation (for example, amplitude attenuation) on the correction signal CA outputted by the phase-locked loop circuit 143, and the attenuator 146 transmits an attenuated correction signal CA to the input terminal 131 of the gain circuit 130 through the switching circuit 160 (or sequentially through the correction terminal 141 and the first switch 161A of the switching circuit 160), so that a voltage value of the correction signal CA is within a manageable range of the gain circuit 130. In some embodiments, the correction circuit 140 further includes a linear regulator 147 (Low Dropout Linear Regulator, LDO). In the test mode, the switching circuit 160 is in the first state, and the linear regulator 147 linearly stabilize a voltage of the correction signal CA outputted by the phase-locked loop circuit 143, so that correction signals CA corresponding to different indicated frequencies (detailed later) have the same amplitude (the same voltage amplitude), and the linear regulator 147 transmits a stabilized correction signal CA to the input terminal 131 of the gain circuit 130 through the switching circuit 160 (or sequentially through the correction terminal 141 and the first switch 161A of the switching circuit 160). In some embodiments, the attenuator 146 is coupled to the linear regulator 147, and the attenuator 146 and the Linear regulator 147 are coupled between the phase-locked loop circuit 143 and the correction terminal 141. In other words, if one of the attenuator 146 and the linear regulator 147 is coupled to the phase-locked loop circuit 143, the other is coupled to the correction terminal 141. Therefore, it should be understood that although FIG. 1 shows that the attenuator 146 is coupled to the phase-locked loop circuit 143 and the linear regulator 147 is coupled to the correction terminal 141, the present invention is not limited thereto. In the correction circuit 140, the attenuator 146 may be coupled to the correction terminal 141, and the linear regulator 147 may be coupled to the phase-locked loop circuit 143.

In some embodiments, the gain circuit 130 includes a pre-amplifier 135, a balanced to unbalanced (Balun) 136, a quadrature modulation circuit 133, a mixer 137, and a fundamental frequency amplifier 138. The pre-amplifier 135 may be a low noise amplifier (LNA), and the fundamental frequency amplifier 138 may be a transimpedance amplifier (TIA). The balun 136 may be implemented by a transformer. The pre-amplifier 135 is coupled to the input terminal 131 and a bias terminal 134. The pre-amplifier 135 performs, according to the bias voltage $V_{bias}$, small signal amplification on the to-be-gained signal RX$_T$ to generate a pre-amplified signal $S_A$. The balun 136 is coupled to the pre-amplifier 135. The balun 136 is configured to convert the pre-amplified signal $S_A$ to a differential signal $S_B$. For example, the balun 136 has two inductors. The two inductors are electromagnetically coupled to each other, and the two inductors are respectively on a primary side of the balun 136 (the primary side is a side on which the balun 136 is coupled to the pre-amplifier 135) and a secondary side (the secondary side is a side on which the balun 136 is coupled to the mixer 137). One end of the inductor on the primary side is grounded, and the other end is coupled to the pre-amplifier 135 to obtain the pre-amplified signal $S_A$. Through the electromagnetic coupling between the inductors on the primary side and the secondary side, the inductor on the secondary side of the balun 136 generates the differential signal $S_B$, that is, the balun 136 converts a single-ended signal (the pre-amplified signal $S_A$) to the differential signal $S_B$.

The quadrature modulation circuit 133 is coupled to the clock generation circuit 120 and the mixer 137. The quadrature modulation circuit 133 performs quadrature modulation according to the reference clock LO to generate a quadrature signal IQ. For example, the quadrature modulation circuit 133 includes a phase shifter with a phase shift of ninety degrees, and the quadrature signal IQ is generated after a phase shift is performed on the reference clock LO by the phase shifter, wherein the quadrature signal IQ includes an in-phase signal and a quadrature-phase signal. The mixer 137 is coupled to the balun 136 and the quadrature modulation circuit 133. The mixer 137 mixes the differential signal $S_B$ with the quadrature signal IQ to generate a mixed signal $S_C$. The fundamental frequency amplifier 138 is coupled between the mixer 137 and the output terminal 132. The fundamental frequency amplifier 138 applies a fundamental frequency gain to the mixed signal $S_C$ to generate a gained signal $RX_A$. For example, the fundamental frequency amplifier 138 amplifies a current signal of the mixed signal $S_C$ and converts the current signal to a voltage signal to serve as the gained signal $RX_A$.

Figure 3:
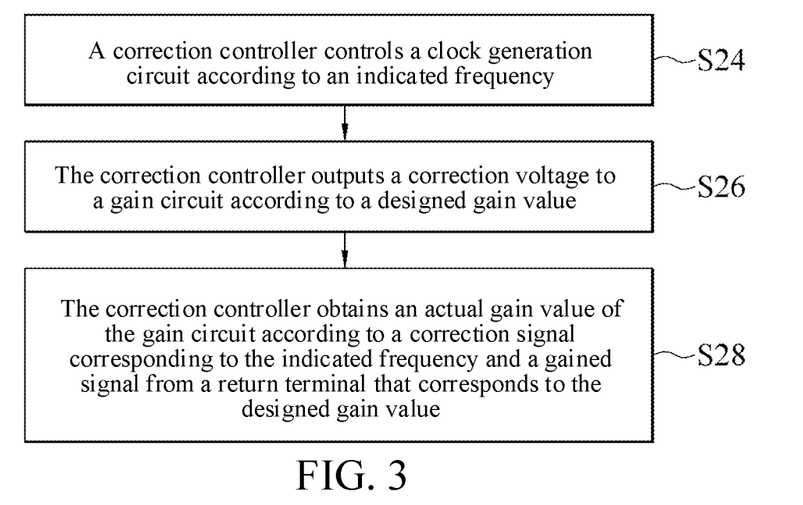
FIG. 3 is a flowchart of a correction controller when a switching circuit is in a first state in a test mode according to some embodiments of the present invention.

Referring to FIG. 1 and FIG. 3, FIG. 3 is a flowchart of a correction controller 145 when the switching circuit 160 is in the first state in the test mode according to some embodiments of the present invention. In some embodiments, the correction circuit 140 further includes a correction controller 145. The correction controller 145 is coupled to the clock generation circuit 120, the phase-locked loop circuit 143 (or the attenuator 146, or the linear regulator 147, or the correction terminal 141), and the return terminal 142. The correction controller 145 may be an operational circuit such as an embedded controller, a central processing unit, a microprocessor, an application-specific integrated circuit, a system-on-chip, or the like. In the test mode, the switching circuit 160 is in the first state, and the correction controller 145 performs the following steps S24 to S28. The correction controller 145 controls the clock generation circuit 120 according to an indicated frequency, so that a clock rate of the reference clock LO generated by the clock generation circuit 120 conforms to the indicated frequency (step S24). The correction controller 145 outputs a correction voltage $V_{bc}$ to the gain circuit 130 according to a designed gain value. In the test mode, the gain circuit 130 gains, according to the correction voltage $V_{bc}$ that is the bias voltage $V_{bias}$, the correction signal CA that is the to-be-gained signal $RX_T$ (step S26). Then, the return terminal 142 of the correction circuit 140 receives the gained signal $RX_{A1}$ of the gain circuit 130. The correction controller 145 obtains, according to the correction signal CA corresponding to the indicated frequency and the gained signal $RX_{A1}$ from the return terminal 142 that corresponds to the designed gain value, an actual gain value of the gain circuit 130 (step S28).

Specifically, due to factors such as a manufacturing process, there is a difference (which is also referred to as an error) between the actual gain value of the gain circuit 130 and the designed gain value of the gain circuit 130. Therefore, the correction controller 145 performs steps S24 to S28 to obtain the actual gain value of the gain circuit 130 through testing when the gain circuit 130 gains the to-be-gained signal $RX_T$ by using the designed gain value. For example, the correction controller 145 stores a test comparison table (for example, the test comparison table is stored in a memory (not shown) of the correction controller 145, and may be inputted to the memory of the correction controller 145 by a user through an input/output interface (not shown)), and the correction controller 145 performs steps S24 to S28 (that is, a correction test) according to the test comparison table. The test comparison table records different indicated frequencies and records designed gain values, correction voltages $V_{bc}$, and control voltages corresponding to the indicated frequencies, wherein the control voltages are for controlling the clock generation circuit 120.

In some embodiments of step S24, the correction controller 145 selects an indicated frequency from the test comparison table, and reads a control voltage corresponding to the indicated frequency in the test comparison table to output the control voltage to the clock generation circuit 120. The clock generation circuit 120 adjusts, in response to the control voltage, the clock rate of the reference clock LO to the indicated frequency, wherein the reference clock LO is generated by the clock generation circuit 120. Furthermore, the phase-locked loop circuit 143 generates, according to the reference clock LO adjusted to the indicated frequency, the correction signal CA through synchronization, so that the frequency of the correction signal CA corresponds to (or is the same as) the indicated frequency.

In some embodiments of step S26, the correction controller 145 reads the selected indicated frequency and reads the designed gain value and the correction voltage $V_{bc}$ corresponding to the selected indicated frequency from the test comparison table, and the correction controller 145 outputs the read correction voltage $V_{bc}$ to the gain circuit 130. In the test mode, the gain circuit 130 gains, by using the correction voltage $V_{bc}$ as the bias voltage $V_{bias}$, the correction signal CA that is the to-be-gained signal $RX_T$ (in other words, in the test mode, the gain circuit 130 gains the correction signal CA according to the correction voltage). Stated another way, at this time, the gain circuit 130 performs gaining by using the read designed gain value.

In some embodiments of step S28, the correction controller 145 obtains the actual gain value of the gain circuit 130 by subtracting the signal strength of the correction signal CA from the signal strength of the gained signal $RX_{A1}$ received from the return terminal 142, as shown in Equation 1. For example, if the signal strength of the gained signal $RX_{A1}$ is −30 dBm and the signal strength of the correction signal CA is −70 dBm, the actual gain value calculated by the correction controller 145 is 40 dBm. $RX_{A1S}$ in Equation 1 is the signal strength of the gained signal $RX_{A1}$, $CA_S$ is the signal strength of the correction signal CA, and SI is the actual gain value.

$$RX_{A1S} - CA_S = SI \qquad \text{(Equation 1)}$$

In some embodiments, the correction controller 145 generates, according to a plurality of indicated frequencies and an actual gain value corresponding to each of the indicated frequencies, the correction table. In other words, the correction table may record different frequencies (indicated frequencies) and actual gain values corresponding to the indicated frequencies. For example, referring to Table 1, at a time point, the correction controller 145 performs steps S24 to S28 according to an indicated frequency (referred to as a first indicated frequency herein), and then the correction controller 145 associates the obtained actual gain value with the first indicated frequency. At another time point, the correction controller 145 performs steps S24 to S28 according to another indicated frequency (referred to as a second indicated frequency herein), and then the correction controller 145 associates the obtained actual gain value with the second indicated frequency. By analogy, after each preset indicated value is used by the correction controller 145 to perform steps S24 to S28, the correction controller 145 integrates the indicated frequencies and the actual gain values corresponding to the indicated frequencies to generate the correction table.

In Table 1, CH36-CH48 is exemplified, and other channels all have compensation values.

| Channel | Indicated frequency (GHz) | Gain difference (dB) = Ideal gain (designed gain)-Actual gain |
|---|---|---|
| CH 36 | 5.18 | 0.8 (for example), actual corrected value |
| CH 40 | 5.2 | There is no actual corrected value, and therefore a gain difference between frequencies of CH36 and CH48 is used as an interpolation |
| CH 44 | 5.22 | There is no actual corrected value, and therefore a gain difference between frequencies of CH36 and CH48 is used as an interpolation |
| CH 48 | 5.24 | −0.6 (for example), actual corrected value |

In some embodiments, a number of correspondences between the indicated frequency and the actual gain value in the correction table may be set according to a frequency range applicable to the signal transmission of the communication chip 100 (for example, a frequency range applicable to signal transmission between the communication chip 100 and another communication chip 100'). For example, an indicated frequency column in the correction table records a plurality of indicated frequencies set at an interval of 0.1 Hz in the above frequency range, and the actual gain values corresponding to the indicated frequencies are recorded in an actual gain value column of the correction table, thereby forming the correction table. In some embodiments, the frequency range applicable to the communication chip 100 may be 2.4 GHz to 2.5 GHz and 5 GHz to 7.2 GHz. Therefore, a frequency range of the indicated frequency may be 2.4 GHz to 2.5 GHz and 5 GHz to 7.2 GHz. Correspondingly, a frequency range of the input signal $RX_I$ of the input port 110 may be 2.4 GHz to 2.5 GHz and 5 GHz to 7.2 GHz. Since the correction signal CA is used to simulate the input signal $RX_I$, a frequency range of the correction signal CA may be 2.4 GHz to 2.5 GHz and 5 GHz to 7.2 GHz.

In some embodiments, as shown in FIG. 1, the gain circuit 130 further includes a bias voltage terminal 134, and the gain circuit 130 obtains the bias voltage $V_{bias}$ used during gaining from the bias voltage terminal 134. The correction circuit 140 further includes a correction voltage terminal 144. The correction controller 145 is coupled to the correction voltage terminal 144, and the correction controller 145 outputs the correction voltage $V_{bc}$ through the correction voltage terminal 144 in the test mode. The third switch 161C in the switching circuit 160 is coupled between the correction voltage terminal 144 of the correction circuit 140, a target voltage terminal 152 of the post-processing circuit 150, and the bias terminal 134 of the gain circuit 130. In the test mode, the third switch 161C is in the first state, and connects the correction voltage terminal 144 of the correction circuit 140 to the bias terminal 134 of the gain circuit 130 (that is, a conduction between the correction voltage terminal 144 and the bias terminal 134 is established), and cuts off a connection between the target voltage terminal 152 of the post-processing circuit 150 and the bias terminal 134 of the gain circuit 130 (disconnects the target voltage terminal 152 from the bias terminal 134, that is, a conduction between the target voltage terminal 152 and the bias terminal 134 is not established). In this way, the gain circuit 130 uses the correction voltage $V_{bc}$ as the bias voltage $V_{bias}$.

In some embodiments, the correction circuit 140 further includes a plurality of analog-to-digital converters (ADC) 148, 149. The analog-to-digital converter 148 is disposed between the correction controller 145 and the return terminal 142. The analog-to-digital converter 149 is disposed between the correction controller 145 and the phase-locked loop circuit 143 (or the attenuator 146, or the linear regulator 147, or the correction terminal 141). Specifically, a digital terminal of the analog-to-digital converter 148 is coupled to the correction controller 145, and an analog terminal of the analog-to-digital converter 148 is coupled to the return terminal 142. A digital terminal of the analog-to-digital converter 149 is coupled to the correction controller 145, and an analog terminal of the analog-to-digital converter 149 is coupled to the phase-locked loop circuit 143 (or the attenuator 146, or the linear regulator 147, or the correction terminal 141). The analog-to-digital converter 148 converts the gained signal $RX_{A1}$ from an analog signal to a digital signal for the correction controller 145 to identify, wherein the gained signal $RX_{A1}$ is from the return terminal 142. The analog-to-digital converter 149 converts the correction signal CA from the analog signal to the digital signal for the correction controller 145 to identify, wherein the correction signal CA is from the phase-locked loop circuit 143 (or the attenuator 146, or the linear regulator 147, or the correction terminal 141). In some embodiments, the analog-to-digital converter 148 and the analog-to-digital converter 149 may be integrated into a single circuit (a single analog-to-digital converter).

Figure 4:
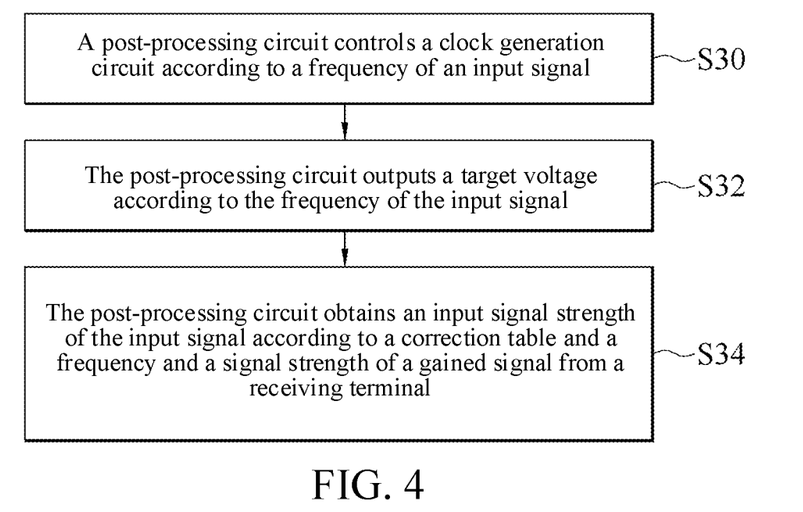
FIG. 4 is a flowchart of a post-processing circuit when a switching circuit is in a second state in an operating mode according to some embodiments of the present invention.

Referring to FIG. 1 and FIG. 4, FIG. 4 is a flowchart of the post-processing circuit 150 when the switching circuit 160 is in the second state in the operating mode according to some embodiments of the present invention. In some embodiments, in the operating mode, the switching circuit 160 is in the second state, and the post-processing circuit 150 performs the following steps S30 to S34. The post-processing circuit 150 controls the clock generation circuit 120 according to a frequency of the input signal $RX_I$, so that the clock rate of the reference clock LO generated by the clock generation circuit 120 matches the frequency of the input signal $RX_I$ (step S30). The post-processing circuit 150 outputs a target voltage $V_{ba}$ according to the frequency of the input signal $RX_I$ (step S32). In the operating mode, the gain circuit 130 gains, according to the target voltage $V_{ba}$ that is the bias voltage $V_{bias}$, the input signal $RX_I$ that is the to-be-gained signal $RX_T$. Then, the receiving terminal 151 of the post-processing circuit 150 receives a gained signal $RX_{A2}$ of the gain circuit 130. Then, the post-processing circuit 150 obtains the input signal strength of the input signal $RX_I$ (that is, a signal strength of the input signal $RX_I$ before amplified) according to the correction table and a frequency and a signal strength of the gained signal $RX_{A2}$ from the receiving terminal 151 (step S34).

For example, the post-processing circuit 150 stores a gain comparison table (for example, the gain comparison table is stored in a memory (not shown) of the post-processing circuit 150, may be inputted to the memory of the post-processing circuit 150 by a user through an input/output interface (not shown)), and the post-processing circuit 150 performs steps S30 to S34 (that is, performs compensation for the signal strength) according to the gain comparison table. The gain comparison table records different frequencies of the input signal $RX_I$ and records designed gain values, target voltages $V_{ba}$, and control voltages corresponding to the frequencies, wherein the control voltages are for controlling the clock generation circuit 120.

In some embodiments of step S30, the post-processing circuit 150 may first obtain the frequency of the input signal $RX_I$. For example, a frequency detector (FD) (not shown) of the communication chip 100 is coupled to the input port 110 to detect the frequency of the current input signal $RX_I$ of the input port 110, and the post-processing circuit 150 is coupled to the frequency detector to obtain the frequency of the input signal $RX_I$. After obtaining the frequency of the current input signal $RX_I$, the post-processing circuit 150 reads the gain comparison table according to the frequency of the input signal $RX_I$ to find a control voltage corresponding to the frequency of the input signal $RX_I$, and the post-processing circuit 150 outputs the control voltage to the clock generation circuit 120. The clock generation circuit 120 adjusts, in response to the control voltage, the clock rate of the reference clock LO to the frequency of the current input signal $RX_I$, wherein the reference clock LO generated by the clock generation circuit 120, so that a frequency of the quadrature signal IQ of the quadrature modulation circuit 133 of the gain circuit 130 corresponds to (or is the same as) the frequency of the current input signal $RX_I$. Therefore, in the operating mode, the frequency of the signal (that is, the input signal $RX_I$ that is the to-be-gained signal $RX_T$) of the input terminal 131 of the gain circuit 130 is consistent with that of a signal (such as the quadrature signal IQ) generated by the gain circuit 130 during gaining. In this way, the frequency of the gained signal $RX_{A2}$ corresponds to (or is the same as) the frequency of the current input signal $RX_I$.

In some embodiments of step S32, the post-processing circuit 150 reads a corresponding designed gain value and a corresponding target voltage $V_{ba}$ in the gain comparison table according to the frequency of the current input signal $RX_I$, and the post-processing circuit 150 outputs the read target voltage $V_{ba}$ to the gain circuit 130. The gain circuit 130 gains, by using the target voltage $V_{ba}$ as the bias voltage $V_{bias}$, the input signal $RX_I$ that is the to-be-gained signal $RX_T$ (in other words, in the operating mode, the gain circuit 130 gains the input signal $RX_I$ according to the target voltage $V_{ba}$). Stated another way, at this time, the gain circuit 130 performs gaining by using the read designed gain value.

In some embodiments of step S34, the post-processing circuit 150 compares the frequency of the gained signal $RX_{A2}$ with the indicated frequency column in the correction table to find an indicated frequency in the indicated frequency column that is the same as the frequency of the gained signal $RX_{A2}$. The post-processing circuit 150 reads an actual gain value corresponding to the indicated frequency that is found. The post-processing circuit 150 compensates the signal strength of the gained signal $RX_{A2}$ with the found actual gain value to obtain the input signal strength of the input signal $RX_I$. For example, as shown in Equation 2, the post-processing circuit 150 obtains the input signal strength of the input signal $RX_I$ by subtracting the actual gain value from the signal strength of the gained signal $RX_{A2}$. $RX_{A2S}$ in Equation 2 is the signal strength of the gained signal $RX_{A2}$, $RX_{IS}$ is the signal strength of the input signal $RX_I$, and SI is the actual gain value. Therefore, since the input signal strength of the input signal $RX_I$ is calculated by using the actual gain value, an input signal strength returned by the post-processing circuit 150 to the communication chip 100' through the signal transmitting circuit 180 is close to the actual strength of the input signal $RX_I$.

$$RX_{A2S} - SI = RX_{IS} \quad \text{(Equation 2)}$$

For example, assuming that the actual strength of the input signal $RX_I$ is −70 dBm and the frequency of the input signal is 5 GHz, and the frequency of the gained signal $RX_{A2}$ is 5 GHz and the signal strength of the gained signal is −30 dBm, a corresponding actual gain value in the correction table is 40 dBm. Therefore, the post-processing circuit 150 may obtain the input signal strength of the input signal $RX_I$ as −70 dBm through calculation by using Equation 2.

In a comparative example, the input signal strength of the input signal $RX_I$ is estimated by using the signal strength of the gained signal $RX_{A2}$ and the designed gain value. Similar to the foregoing example, the designed gain value is 45 dBm at this time, and the input signal strength of the input signal $RX_I$ estimated in the comparative example is −75 dBm. Compared with some embodiments of the present invention, the input signal strength estimated in the comparative example is less close to the actual strength of the input signal $RX_I$. In other words, the input signal strength of the input signal $RX_I$ obtained in some embodiments of the present invention is closer (or substantially the same as) the actual strength of the input signal $RX_I$.

In some embodiments, the post-processing circuit 150 further includes a target voltage terminal 152, and outputs a target voltage $V_{ba}$ through the target voltage terminal 152 in the operating mode. In the operating mode, the third switch 161C in the switching circuit 160 is in the second state, and the third switch 161C connects the target voltage terminal 152 of the post-processing circuit 150 to the bias terminal 134 of the gain circuit 130 (that is, the conduction between the target voltage terminal 152 and the bias terminal 134 is established), and the third switch 161C cuts off a connection between the correction voltage terminal 144 of the correction circuit 140 and the bias terminal 134 of the gain circuit 130 (disconnects the correction voltage terminal 144 from the bias terminal 134, that is, the conduction between the correction voltage terminal 144 and the bias terminal 134 is not established). In this way, the gain circuit 130 uses the target voltage $V_{ba}$ as the bias voltage $V_{bias}$.

In some embodiments, the test comparison table, the gain comparison table, and the correction table may be integrated into a single comparison table and stored in the post-processing circuit 150 or the memory (not shown) in the correction circuit 140. In some embodiments, the test comparison table, the gain comparison table, and the correction table correspond to each other. In some embodiments, a number of correspondences between the indicated frequency, the designed gain value, the correction voltage $V_{bc}$, and the control voltage in the test comparison table is the same as the number of the correspondences between the indicated frequency and the actual gain value in the correction table. In some embodiments, a number of correspondences between the frequency of the input signal $RX_I$, the designed gain value, the target voltage $V_{ba}$, and the control voltage in the gain comparison table may be the same as or less than the number of the correspondences in the above test comparison table (or the number of the correspondences in the above correction table).

In some embodiments, the post-processing circuit 150 further includes a fundamental frequency filter 154, an analog-to-digital converter 155, and a processor 156. The processor 156 may be an operational circuit such as an embedded controller, a central processing unit, a microprocessor, an application-specific integrated circuit, a systemon-chip, or the like. The processor 156 is coupled to the analog-to-digital converter 155, and performs above steps S30 to S34 in the operating mode. The fundamental frequency filter 154 is coupled to the receiving terminal 151 to perform fundamental frequency filtering on the gained signal $RX_{A2}$. The analog-to-digital converter 155 is coupled to the fundamental frequency filter 154 to convert the gained signal $RX_{A2}$ after the fundamental frequency filtering from an analog signal to a digital signal for the processor 156 to identify.

Figure 5:
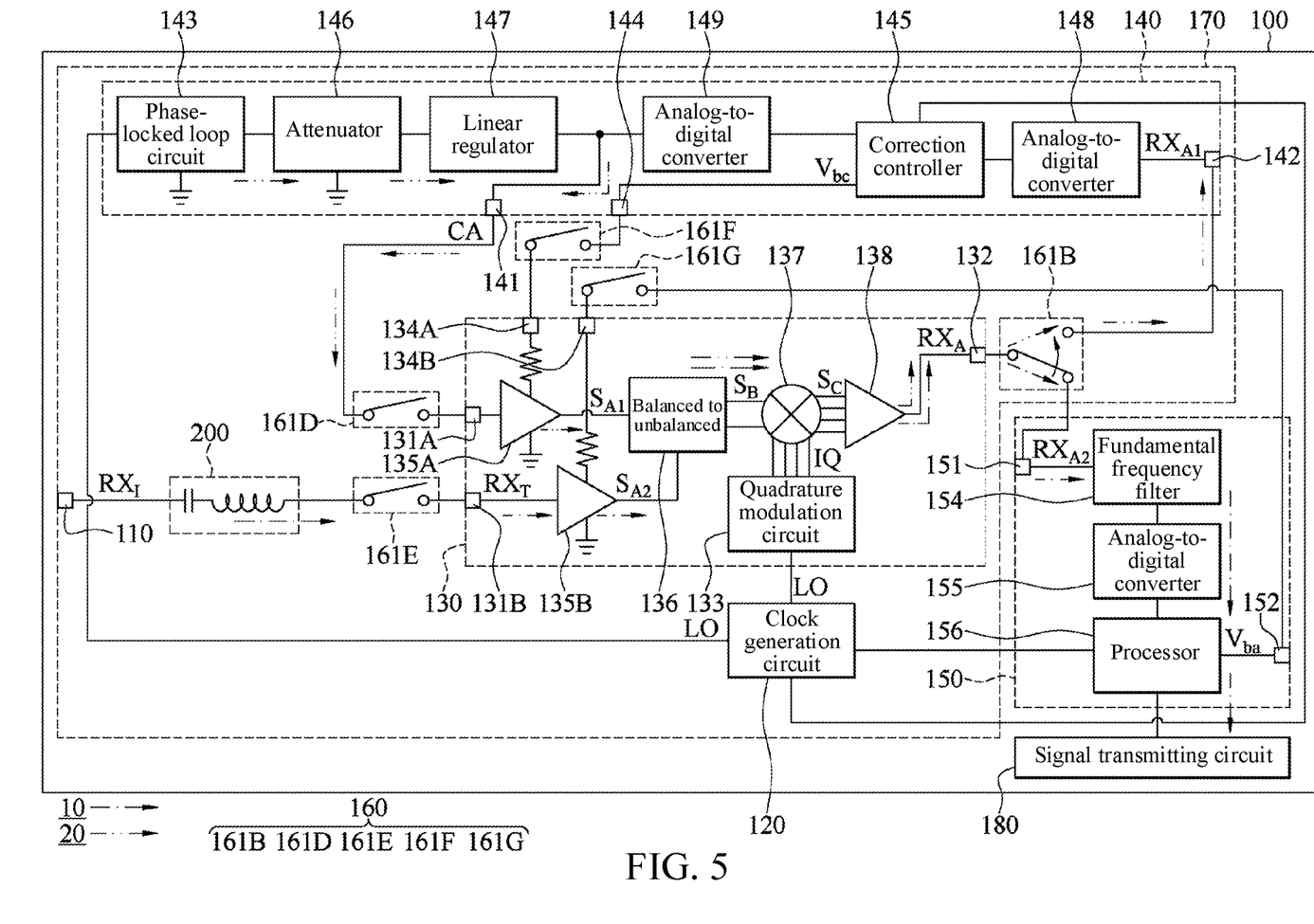
FIG. 5 is a schematic block diagram of a communication chip according to some embodiments of the present invention.

Referring to FIG. 5, FIG. 5 is a schematic block diagram of a communication chip according to some embodiments of the present invention. Compared with FIG. 1, the communication chip 100 in the embodiment of FIG. 5 may include a plurality of input terminals 131 (for example, a first input terminal 131A and a second input terminal 131B), and the input terminals 131 respectively receive different signals. Specifically, the switching circuit 160 couples the correction signal CA to the first input terminal 131A in the test mode, and the switching circuit 160 couples the input signal $RX_I$ to the second input terminal 131B in the operating mode. For example, a fourth switch 161D of the switching circuit 160 is coupled between the correction terminal 141 and the first input terminal 131A, and a fifth switch 161E of the switching circuit 160 is coupled between the input terminal 131 and the input port 110 (or the input matching circuit 200).

In the test mode, the fourth switch 161D is in the first state and connects the correction terminal 141 to the first input terminal 131A (that is, the conduction between the correction terminal 141 and the first input terminal 131A is established), so that the first input terminal 131A receives the correction signal CA in the test mode. In the test mode, the fifth switch 161E is in the first state and cuts off a connection between the second input terminal 131B and the input port 110 (or the input matching circuit 200) (disconnects the second input terminal 131B from the input port 110 or the input matching circuit 200, that is, the conduction between the second input terminal 131B and the input port 110 or the conduction between the second input terminal 131B and the input matching circuit 200 is not established). Thus, a signal path 20 is formed (the path shown by the two-dot chain line in the drawing), so that the gain circuit 130 can perform gaining on only the correction signal CA in the test mode.

In the operating mode, the fifth switch 161E is in the second state and connects the second input terminal 131B to the input port 110 (or the input matching circuit 200) (that is, the conduction between the second input terminal 131B and the input port 110 or the conduction between the second input terminal 131B and the input matching circuit 200 is established), so that the second input terminal 131B receives the input signal $RX_I$ in the operating mode. In the operating mode, the fourth switch 161D is in the second state and cuts off a connection between the correction terminal 141 and the first input terminal 131A (disconnects the correction terminal 141 from the first input terminal 131A, that is, the conduction between the correction terminal 141 and the first input terminal 131A is not established). Thus, a signal path 10 is formed (shown by the one-dot chain line in the drawing), so that the gain circuit 130 can perform gaining on only the input signal $RX_I$ in the operating mode.

In some embodiments, in the operating mode, the input matching circuit 200 transmits the input signal $RX_I$ after phase matching and impedance matching to the second input terminal 131B through the switching circuit 160 (for example, the fifth switch 161E of the switching circuit 160).

Compared with FIG. 1, the communication chip 100 in the embodiment of FIG. 5 may include a plurality of pre-amplifiers 135 (for example, a first pre-amplifier 135A and a second pre-amplifier 135B) and a plurality of bias terminals 134 (for example, a first bias terminal 134A and a second bias terminal 134B). The first pre-amplifier 135A is coupled between the first input terminal 131A and the balun 136. The second pre-amplifier 135B is coupled between the second input terminal 131B and the balun 136. In the test mode, the first pre-amplifier 135A performs, according to the correction voltage $V_{bc}$, small signal amplification on the correction signal CA to generate a first pre-amplified signal $S_{A1}$. In the operating mode, the second pre-amplifier 135B performs, according to the target voltage $V_{ba}$, small signal amplification on the input signal $RX_I$ to generate a second pre-amplified signal $S_{A2}$. The balun 136 converts the first pre-amplified signal $S_{A1}$ to a differential signal $S_B$ in the test mode, and converts the second pre-amplified signal $S_{A2}$ to the differential signal $S_B$ in the operating mode.

For example, a sixth switch 161F of the switching circuit 160 is coupled between the correction voltage terminal 144 and the first bias terminal 134A, and a seventh switch 161G of the switching circuit 160 is coupled between the target voltage terminal 152 and the second bias terminal 134B. In the test mode, the sixth switch 161F is in the first state and connects the correction voltage terminal 144 to the first bias terminal 134A (that is, the conduction between the correction voltage terminal 144 and the first bias terminal 134A is established), so that the first pre-amplifier 135A receives the correction voltage $V_{bc}$ in the test mode to perform small signal amplification on the correction signal CA. In the test mode, the seventh switch 161G is in the first state and cuts off a connection between the target voltage terminal 152 and the second bias terminal 134B (disconnects the target voltage terminal 152 from the second bias terminal 134B, that is, the conduction between the target voltage terminal 152 and the second bias terminal 134B is not established). In the operating mode, the sixth switch 161F is in the second state and cuts off the connection between the correction voltage terminal 144 and the first bias terminal 134A (disconnects the correction voltage terminal 144 from the first bias terminal 134A, that is, the conduction between the correction voltage terminal 144 and the first bias terminal 134A is not established). In the operating mode, the seventh switch 161G is in the second state and connects the target voltage terminal 152 to the second bias voltage terminal 134B (that is, the conduction between the target voltage terminal 152 and the second bias terminal 134B is established), so that the second pre-amplifier 135B receives the target voltage $V_{ba}$ in the operating mode, and can perform small signal amplification on the input signal $RX_I$.

In some embodiments, some components or circuits (for example, a common gate circuit therein) of the first pre-amplifier 135A and the second pre-amplifier 135B may be integrated together, and some components or circuits (for example, a common source circuit therein) may not be integrated together. Alternatively, the first pre-amplifier 135A and the second pre-amplifier 135B may be independent circuits. In some embodiments, the first pre-amplifier 135A and the second pre-amplifier 135B may have the same or similar components or circuits therein.

In some embodiments, in the test mode, the switching circuit 160 is in the first state, and other correction tests may be performed on the signal path 20 formed between the correction circuit 140 and the gain circuit 130 through the switching circuit 160. For example, the correction controller 145 of the correction circuit 140 may perform operations related to a correction test for an image response rejection ratio (IMRR) or an image rejection ratio (IRR) by using the correction signal CA and the gained signal $RX_{A1}$. For example, the correction controller 145 performs the correction test for the image response rejection ratio (or the image rejection ratio) by using the correction signal CA, the gained signal $RX_{A1}$, and Equation 3. The IMRR in Equation 3 is the image response rejection ratio (or the image rejection ratio), $\gamma$ is a gain imbalance value between the correction signal CA and the gained signal $RX_{A1}$, $\epsilon$ is a constant (as shown in Equation 4), and $\emptyset$ is a phase imbalance value between the correction signal CA and the gained signal $RX_{A1}$.

$$IMMR = \frac{\gamma^2 + 1 + 2\gamma\cos(\emptyset)}{\gamma^2 + 1 - 2\gamma\cos(\emptyset)} \approx \frac{4}{\epsilon^2 + \emptyset^2} \quad \text{(Equation 3)}$$

$$\epsilon = \gamma - 1 \quad \text{(Equation 4)}$$

Based on the above, according to some embodiments of the present invention, there is a clock correlation between the correction circuit and the gain circuit of the communication chip, thereby reducing a possibility of signal interference during the correction (for example, avoiding signal loss, matching loss, a frequency shift, and the like caused by an excessively long connection line of the correction circuit), and reducing a time course of gain correction and an error that occurs during the gain correction. In some embodiments, the correction circuit of the chip may be turned on and off. Therefore, a user may turn on the correction circuit when the gain correction is required, and turn off the correction circuit when the gain correction is not required, so as to save energy of the communication chip and prevent a signal path and a function of the communication chip in a normal operating state from being interfered by the correction circuit.

What is claimed is:

1. A communication chip, having a test mode and an operating mode and comprising:
   an input port;
   a clock generation circuit configured to generate a reference clock;
   a gain circuit comprising an input terminal and a quadrature modulation circuit, wherein the gain circuit is configured to gain, according to a bias voltage, a to-be-gained signal from the input terminal and output a gained signal, and the quadrature modulation circuit operates according to the reference clock to generate a signal for gaining the to-be-gained signal;
   a correction circuit comprising a phase-locked loop circuit and a return terminal, wherein the phase-locked loop circuit is configured to generate a correction signal through synchronization according to the reference clock;
   a post-processing circuit comprising a receiving terminal and configured to obtain, according to a correction table and a signal from the receiving terminal, an input signal strength; and
   a switching circuit configured to couple the correction signal to the input terminal in the test mode, couple the gained signal to the return terminal in the test mode, couple the input port to the input terminal in the operating mode, and couple the gained signal to the receiving terminal in the operating mode.

2. The communication chip according to claim 1, wherein the correction circuit further comprises:
   a correction controller configured, in the test mode, to:
      control the clock generation circuit according to an indicated frequency, so that a clock rate of the reference clock generated by the clock generation circuit conforms to the indicated frequency;
      output a correction voltage according to a designed gain value, so that the gain circuit gains, according to the correction voltage that is the bias voltage, the correction signal that is the to-be-gained signal; and
      obtain an actual gain value of the gain circuit according to the correction signal corresponding to the indicated frequency and the gained signal from the return terminal that corresponds to the designed gain value.

3. The communication chip according to claim 2, wherein the correction controller obtains the actual gain value of the gain circuit by subtracting a signal strength of the correction signal from a signal strength of the gained signal from the return terminal.

4. The communication chip according to claim 2, wherein the correction controller generates, according to a plurality of indicated frequencies and the actual gain value corresponding to each of the indicated frequencies, the correction table.

5. The communication chip according to claim 2, wherein the correction circuit further comprises a linear regulator, wherein the linear regulator is configured, in the test mode, to linearly stabilize a voltage of the correction signal, so that correction signals corresponding to different indicated frequencies have a same amplitude, and the linear regulator transmits the stabilized correction signal to the input terminal of the gain circuit through the switching circuit.

6. The communication chip according to claim 2, wherein the correction circuit further comprises an attenuator, wherein the attenuator is configured, in the test mode, to attenuate the correction signal and transmits the attenuated correction signal to the input terminal of the gain circuit through the switching circuit.

7. The communication chip according to claim 1, wherein the gain circuit further comprises:
   a pre-amplifier configured to perform, according to the bias voltage, small signal amplification on the to-be-gained signal to generate a pre-amplified signal;
   a balun configured to convert the pre-amplified signal to a differential signal;
   a mixer configured to mix the differential signal with a quadrature signal to generate a mixed signal; and
   a fundamental frequency amplifier configured to apply a fundamental frequency gain to the mixed signal to generate the gained signal, wherein the quadrature modulation circuit is configured to perform, according to the reference clock, quadrature modulation to generate the quadrature signal.

8. The communication chip according to claim 1, wherein the input port is configured to receive an input signal, and in the operating mode, the gain circuit gains, according to a target voltage that is the bias voltage, the input signal that is the to-be-gained signal, and the post-processing circuit outputs, according to a frequency of the input signal, the target voltage and obtains, according to the correction table and a frequency and a signal strength of the gained signal from the receiving terminal, the input signal strength of the input signal.

9. The communication chip according to claim 8, wherein in the operating mode, the post-processing circuit controls the clock generation circuit according to the frequency of the input signal, so that a clock rate of the reference clock generated by the clock generation circuit conforms to the frequency of the input signal.

10. The communication chip according to claim 1, further comprising an input matching circuit, wherein the input matching circuit is configured, in the operating mode, to perform phase matching and impedance matching on a signal from the input port and transmits a matched signal to the input terminal through the switching circuit.

11. A communication chip, having a test mode and an operating mode and comprising:
    an input port configured to receive an input signal;
    a clock generation circuit configured to generate a reference clock;
    a gain circuit comprising a first input terminal, a second input terminal, and a quadrature modulation circuit, wherein in the test mode, the gain circuit gains, according to a correction voltage, a correction signal from the first input terminal to output a gained signal, and in the operating mode, the gain circuit gains, according to a target voltage, the input signal from the second input terminal to output the gained signal, wherein the quadrature modulation circuit operates according to the reference clock to generate a signal for gaining the correction signal and the input signal;
    a correction circuit comprising a phase-locked loop circuit and a return terminal, wherein the phase-locked loop circuit is configured to generate the correction signal through synchronization according to the reference clock;
    a post-processing circuit comprising a receiving terminal and configured to obtain, according to a correction table and a signal from the receiving terminal, an input signal strength of the input signal; and
    a switching circuit configured to couple the correction signal to the first input terminal in the test mode, couple the gained signal to the return terminal in the test mode, couple the input signal to the second input terminal in the operating mode, and couple the gained signal to the receiving terminal in the operating mode.

12. The communication chip according to claim 11, wherein the correction circuit further comprises:
    a correction controller configured, in the test mode, to:
        control the clock generation circuit according to an indicated frequency, so that a clock rate of the reference clock generated by the clock generation circuit conforms to the indicated frequency;
        output the correction voltage according to a designed gain value; and
        obtain an actual gain value of the gain circuit according to the correction signal corresponding to the indicated frequency and the gained signal from the return terminal that corresponds to the designed gain value.

13. The communication chip according to claim 12, wherein the correction controller obtains the actual gain value of the gain circuit by subtracting a signal strength of the correction signal from a signal strength of the gained signal from the return terminal.

14. The communication chip according to claim 12, wherein the correction controller generates, according to a plurality of indicated frequencies and the actual gain value corresponding to each of the indicated frequencies, the correction table.

15. The communication chip according to claim 12, wherein the correction circuit further comprises a linear regulator, wherein the linear regulator is configured, in the test mode, to linearly stabilize a voltage of the correction signal, so that correction signals corresponding to different indicated frequencies have a same amplitude, and the linear regulator transmits the stabilized correction signal to the first input terminal of the gain circuit through the switching circuit.

16. The communication chip according to claim 12, wherein the correction circuit further comprises an attenuator, wherein the attenuator is configured, in the test mode, to attenuate the correction signal and transmits the attenuated correction signal to the first input terminal of the gain circuit through the switching circuit.

17. The communication chip according to claim 11, wherein the gain circuit further comprises:
    a first pre-amplifier configured to perform, according to the correction voltage, small signal amplification on the correction signal to generate a first pre-amplified signal;
    a second pre-amplifier configured to perform, according to the target voltage, small signal amplification on the input signal to generate a second pre-amplified signal;
    a balun configured to convert the first pre-amplified signal to a differential signal in the test mode and convert the second pre-amplified signal to the differential signal in the operating mode;
    a mixer configured to mix the differential signal with a quadrature signal to generate a mixed signal; and
    a fundamental frequency amplifier configured to apply a fundamental frequency gain to the mixed signal to generate the gained signal, wherein the quadrature modulation circuit is configured to perform, according to the reference clock, quadrature modulation to generate the quadrature signal.

18. The communication chip according to claim 11, wherein in the operating mode, the post-processing circuit outputs, according to a frequency of the input signal, the target voltage and obtains, according to the correction table and a frequency and a signal strength of the gained signal from the receiving terminal, the input signal strength of the input signal.

19. The communication chip according to claim 18, wherein in the operating mode, the post-processing circuit controls the clock generation circuit according to the frequency of the input signal, so that a clock rate of the reference clock generated by the clock generation circuit conforms to the frequency of the input signal.

20. The communication chip according to claim 11, further comprising an input matching circuit, wherein the input matching circuit is configured, in the operating mode, to perform phase matching and impedance matching on the input signal from the input port and transmits a matched signal to the second input terminal through the switching circuit.

* * * * *